United States Patent [19]

Mizukata et al.

[11] Patent Number: 5,089,792
[45] Date of Patent: Feb. 18, 1992

[54] PHASE LOCKED LOOP WITH PHASE DIFFERENCE SIGNAL ADJUSTMENT CIRCUIT

[75] Inventors: Katsuya Mizukata, Tenri; Makoto Takeda, Nara; Hiroshi Také, Ikoma; Takafumi Kawaguchi, Nara, all of Japan

[73] Assignee: Sharp Kabushiki Kaisha, Osaka, Japan

[21] Appl. No.: 560,592

[22] Filed: Jul. 31, 1990

[30] Foreign Application Priority Data

Jul. 31, 1989 [JP] Japan ................................. 1-199743

[51] Int. Cl.[5] ................................................ H03L 7/93
[52] U.S. Cl. ....................................... 331/17; 331/20; 331/25; 358/158
[58] Field of Search .......................... 331/17, 25, 20; 358/158, 159

[56] References Cited

U.S. PATENT DOCUMENTS 3,921,092 11/1975 Schatz .................... 331/17 X

FOREIGN PATENT DOCUMENTS 1275166 8/1968 Fed. Rep. of Germany .
2436711 2/1975 Fed. Rep. of Germany .
2116432 7/1972 France .
1375978 12/1974 United Kingdom .

OTHER PUBLICATIONS

WO-A-8808644, Nov. 3, 1988 PCT Publication.

Primary Examiner—Siegfried H. Grimm

[57] ABSTRACT

A phase looped oscillating circuit includes a signal comparing device which can compare a plurality of different input signals with each other and emit a signal based on this comparison. The signal comparing device emits a control signal to a level converting device, a signal converting device is operatively connected to the level converting device. A signal from the converting device is received by an oscillating device and an oscillating signal is fed back to the signal comparing device via a divider. To compensate for fluctuation of an invertor in the signal converting device, the signal comparing device provides a fixed level signal stabilized at a 50% duty cycle. This stabilization also stabilizes electrical noises that may be present.

13 Claims, 6 Drawing Sheets

FIG. 7
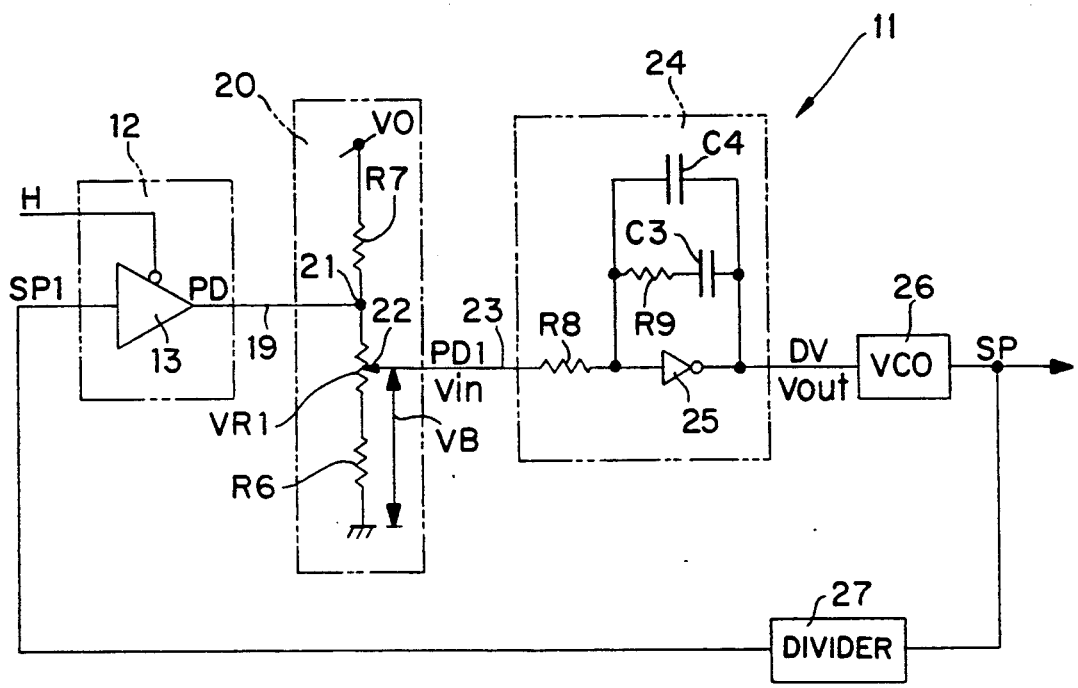
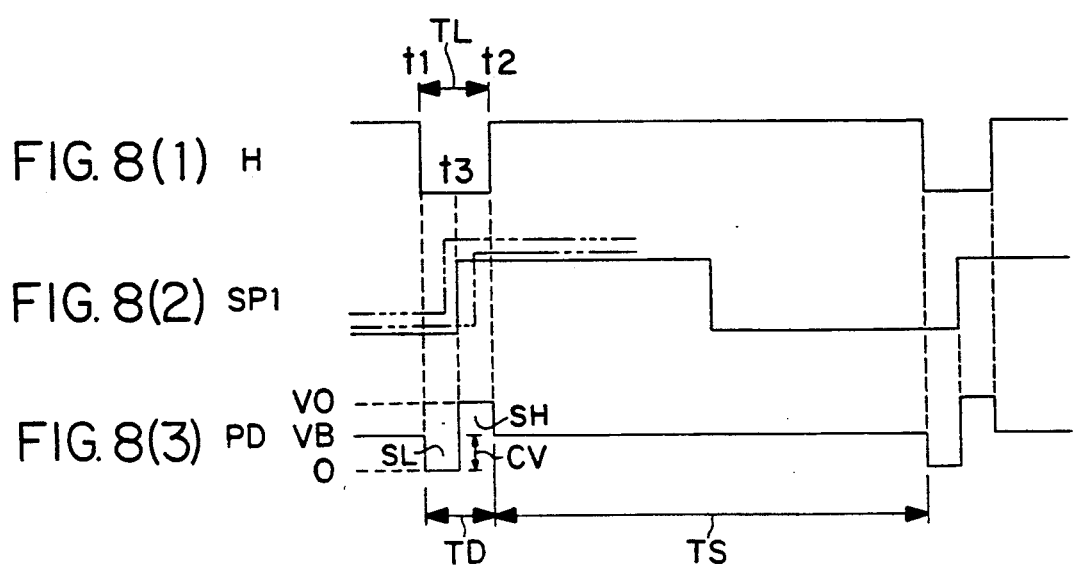
FIG. 8(1) H
FIG. 8(2) SP1
FIG. 8(3) PD

PHASE LOCKED LOOP WITH PHASE DIFFERENCE SIGNAL ADJUSTMENT CIRCUIT

BACKGROUND OF THE INVENTION

1. Field of the Invention

The present invention relates to a phase locked loop oscillating circuit-called hereinafter a PLL circuit.

2. Description of the Prior Art

Usually, a conventional TV receiver uses a PLL circuit as a circuit to generate synchronous pulses with a frequency, which is synchronized, for example, with a horizontal synchronizing signal included in the complex video signal received and which is predetermined upon necessary correction for eventual variation to a certain degree in the frequency of this horizontal synchronizing signal. FIG. 1 shows a block diagram of a typical conventional PLL circuit 1, and the description below will be made by reference to this FIG. 1. This PLL circuit 1 is provided with a phase comparator circuit 2, into which, for example, a horizontal synchronizing signal H separated from the received complex video signal is fed. This phase comparator circuit 2 is equivalent to a three-state buffer 3, which is fed with sychronizing pulses SP1 obtained by dividing, with a divider 9, the synchronizing pulse SP given by a voltage-controlled oscillator (called hereinafter oscillator) 4 included in the PLL circuit 1 and which emits a phase difference signal PD as exhibited on the following truth table.

TABLE 1

| Input | | Output |
|---|---|---|
| H | SP | PD |
| H | | High impedance |
| L | H | H |
| L | L | L |

The phase difference signal PD is fed to a mute adjusting circuit 5, which converts the signal into a phase difference signal PD1, as described later, and feeds it to an active low-pass filter (called hereinafter LPF) 6, where the high frequency components are removed and the filtered voltage DV is fed to the oscillator 4.

The mute adjusting circuit 5 has a resistor R1, a variable resistor VR, and a resistor R2 connected in series, wherein one end of the resistor R1 is grounded while the other end of the resistor R2 is connected with the reference voltage VO (for example 5 V). The LPF 6 includes a resistor R3 in series connection with the mute adjusting circuit 5 and an inverter circuit 7 connected in parallel with a series circuitry of resistor R4 and capacitor C1 and also with a capacitor C2. The inverter circuit 7 is formed as an integrated circuit in which the CMOS (complementary metal oxide semiconductor) technique is incorporated.

The time chart for the fundamental operating condition of the phase comparator circuit 2 is shown in FIGS. 8(1)–8(3) which will also be referred to in description of preferred embodiments. The phase difference signal PD in FIG. 8(3) is obtained by subjecting the level of the synchronizing pulse SP1 while synchronizing signal H in FIG. 8(1) is at Low level, to the level change indicated in Table 1. While the synchronizing signal H is at High level, the three-state buffer 3 shall be in high impedance condition, and the phase difference signal PD is set to the level of the bias voltage VB to be set by the mute adjusting circuit 5.

In case there is no phase difference between the synchronizing pulse SP1 and synchronizing signal H, that is in the condition that the synchronizing pulse SP1 will be switched over from Low to High level at the time t3 as TL/2 has passed from the time t1, where TL represents the Low level period from time t1 to time t2 of the synchronizing signal H as presented in FIG. 8(1), so the phase difference signal PD will be pulses with a duty cycle of 50% as shown in FIG. 2. The center value of the phase difference signal PD has the same level as the bias voltage VB (2.5 V) if the amplitude is selected to VO/2=2.5 V.

At this time, the PLL circuit 1 has the same duty cycle in its range below the bias voltage VB as the one above it, and thus the same frequency range can be used as the correctable range in both cases where the frequency of the synchronizing signal H varies from this condition to the high frequency side and to the low frequency side.

In case the input voltage Vin of the LPF 6 must be varied, the function to adjust the bias voltage VB of the phase difference signal PD1 is accomplished by the mute adjusting circuit 5. That is, the inverter circuit 7, used in the LPF 6, is realized as an integrated circuit according to the CMOS technique as described, and the threshold voltage which serves in determining whether the input voltage is at High or Low level, may vary element by element.

FIG. 3 is a graph exhibiting the input/output voltage relation of an LPF 6 having such an inverter circuit 7 as realized as an integrated circuit due to CMOS technique, wherein the line 11 corresponds to the case with proper threshold voltage while the line 12 corresponds to the case with improperly low threshold voltage, and the line 13 corresponds to the case with improperly high threshold voltage. When an integrated circuit element having such a proper threshold as presented by the line 11 is used as the inverter circuit 7 of the LPF 6, setting the center value of the phase difference signal PD1 to 2.5 V will cause emission of an output Vout=2.0 V in response to Vin=2.5 V in FIG. 3.

In case, by contrast, an integrated circuit element having a characteristic presented by the line 12 is used as the inverter circuit 7, acquisition of the same output voltage Vout=2.0 V involves adjustment for the input voltage Vin=2.0 V by the mute adjusting circuit 5. By this adjustment the phase difference signal PD becomes a signal obtained from the bias voltage VB turned into 2.0 V, shown by the broken line in FIG. 2. Accordingly the area SH of the portion above the new bias voltage VB=2.0 V will become larger than the area SL below the bias voltage VB, and in response thereto the output frequency of the oscillator 4 will vary to cause delay of the synchronizing pulse SP1 in the phase from the synchronizing signal H, as shown by the two-dotted chain line in FIG. 8(2). This gives the phase difference signal PD the same area S1 below the new bias voltage VB=2.0 V as the area SH above it, as indicated in FIG. 4, and the oscillator 4 will now output synchronizing pulses SP which are synchronous with the synchronizing signal H.

In the case that an integrated circuit element having a characteristic presented by the line 13 in FIG. 3 is used as the inverter circuit 7, acquisition of the same output voltage Vout=2.0 V involves adjustment for the input voltage Vin=3.0 V by the mute adjusting circuit 5. By this adjustment the phase difference signal PD becomes a signal obtained from the bias voltage VB turned into 3.0 V, shown by the two-dotted chain line in FIG. 2. Accordingly the area SL of the portion below the new bias voltage VB=3.0 V will become larger than the area SH above the bias voltage VB, and in response thereto the output frequency of the oscillator 4 will vary to cause advance of the synchronizing pulse SP1 in phase from the synchronizing signal H, as shown by the three-dotted chain line in FIG. 8(2). This gives the phase difference signal PD the same area SL below the new bias voltage VB=3.0 V as the area SH above it, as indicated in FIG. 4(2), and the oscillator 4 will now output synchronizing pulses SP which are synchronous with the synchronizing signal H.

The phase difference signal PD with a waveform as indicated in FIG. 4(1) is provided with a deviation that the duty cycles of the portions below and above the bias voltage VB are 60% and 40%, and the phase difference signal PD indicated in FIG. 4(2) is provided with a deviation that the duty cycles of the portions below and above the bias voltage VB are 40% and 60%, respectively, which allows the PLL circuit 1 to be set with different correction ranges for the case in which the synchronizing signal H shifts to a higher frequency side than the synchronizing pulse SP1 and the case of shifting to the lower frequency side. Use of this type of PLL circuit 1 in, for example, a TV receiver does not permit attainment of necessary correction range for varying frequency as specified, to result in generation of such a phenomenon as turbulence in the picture.

In case of further turbulence of the synchronizing signal H causes feeding of noise, pulse PD in FIG. 1 has added noise pulses 8 which are VO=5 or 0 V, as seen in FIG. 5, and the center value of the time average of the noise 8 will be 2.5 V. Use of an integrated circuit element having a proper threshold according to the line 11 in FIG. 3, at this time, for the inverter circuit 7 will give a bias voltage of 2.5 V to be set by the mute adjusting circuit 5, which is in good agreement with the center value of the noise. Use of an inverter circuit 7 having a threshold according to the line 12 in FIG. 3, on the contrary, allows the center value to be set to 2.0 V, as described above, after adjustment by the mute adjusting circuit 5. On the other hand, since the center value of the noise is 2.5 V, the center value as the time average of the whole waveform of phase difference signal PD become 2.25 V which is a median value of the center value of 2.0 V and 2.5 V mentioned above. Wherein in case the eliminated noise 8 causes feeding of the proper synchronizing signal H as shown in FIG. 9 to put the PLL circuit 1 into operation, a problem still remains that the center value will shift immediately from above-mentioned 2.25 V to 2.0 V to cause oscillator 4 to output synchronizing pulses SP with different oscillating frequency between the state of noise 8 and the state of proper synchronizing signal.

SUMMARY OF THE INVENTION

A purpose of the present invention is to solve the described technical problems according to conventional arrangement and provide an improved phase locked loop oscillator circuit, whereby the range of mutual phase variation of a plurality of input signals is made uniform on both the high frequency and low frequency sides to allow emitting of oscillation signals having the same frequency.

Thus the invention applies to a phase locked loop oscillator circuit having structure that includes:

signal comparing means to compare a plurality of input signals with each other and emit a first control signal with a duty cycle corresponding to the degree of difference as a result from the comparison;

level converting means to supply a fixed level signal having a predetermined fixed level to the first control signal and emit the level of this resultant first control signal upon specified conversion;

signal converting means to emit a second control signal at a level corresponding to the duty cycle of the first control signal given by the level converting means; and oscillating means to emit an oscillation signal at a frequency corresponding to the level of the second control signal and feed it to the signal comparing means.

Further this invention applies to a phase-locked loop oscillator circuit that includes:

signal comparing means to compare a plurality of input signals with each other and emit a first control signal with a duty cycle corresponding to the degree of difference as a result from the comparison;

level converting means, to convert the first control signal and emit the level of this resultant first control signal,;

first resistance means supplied with the first control signal to one side terminal and connected with a predetermined first constant level potential at the other terminal, second resistance means supplied with the first control signal to one side terminal and connected with a second constant level potential different from the first constant level potential at the other terminal, variable resistance means supplied respectively with each emission from the first resistance means and the second resistance means at both of its terminals, to produce an output of the difference in potential of each emission, signal converting means to emit a second control signal at a level corresponding to the duty cycle of the first control signal given by the level converting means; and oscillating means to emit an oscillation signal at a frequency corresponding to the level of the second control signal and feed it to the signal comparing means.

Another feature of the invention is that the signal comparing means is a phase comaprator circuit, which compares the phase of the synchronizing signal separated from the complex video signal and emits a first control signal with a duty cycle corresponding to the phase difference.

Further the invention is characterized by, that the level converting means is equipped with a variable resistor interposed between the predetermined reference potential and the ground potential, that the first control signal is fed to this variable resistor, and that it converts the level of the first control signal and emits the result of the conversion.

Also the invention is characterized by that the signal converting means is a low-pass filter equipped with a series circuitry consisting of an inverter circuit in CMOS (complementary metal oxide semiconductor) structure and a resistance.

In this phase locked loop oscillator circuit according to the present invention the signal comparing means is fed with a plurality of input signals including an oscillation signal from the oscillating means, compares the signals with each other, and emits a first control signal with a duty cycle corresponding to the degree of difference obtained as result of the comparison. This first control signal is supplied with a fixed level signal having a predetermined fixed level by the level converting means, and the level of this resultant first control signal is converted. A second control signal at a level corresponding to the duty cycle of the first control signal from the level converting means is emitted by the signal converting means, while an oscillation signal at a frequency corresponding to the level of second control signal is emitted by the oscillating means and fed to the signal comparing means.

Thus the level of the first control signal is converted after being supplied with a fixed level signal, so that its amplitude will also be converted. Even though the center level of the first control signal to be fed to the signal converting means must be shifted, the amplitude of the first control signal will be varied in response to the shift of the center level, which prevents occurrence of such a phenomenon that the duty cycle of the first control signal varies even after adjustment of the center value. This allows the input signal variation range, in which the frequency of the oscillation signal is held in locked condition, to be made uniform on both the high frequency and low frequency sides.

In this phase locked loop oscillator circuit according to present invention the signal comparing means is fed with a plurality of input signals including an oscillation signal from the oscillating means, the signals are compared with each other, and there is emitted a first control signal with a duty cycle corresponding to the degree of difference obtained as a result of the comparison. The first control signal is supplied to one terminal of the first resistance means in the level converting means, a predetermined first constant level potential is connected with the other terminal. The first control signal is supplied to one terminal of the second resistance means, and other terminal is connected with a second constant level potential different from the first constant level potential. Each emission from the first resistance means and second resistance means is supplied respectively to each terminal of the variable resistance means, which converts and outputs the level of difference in potential of each emission.

A second control signal at a level corresponding to the duty cycle of the first control signal from the level converting means is emitted by the signal converting means, while an oscillation signal at a frequency corresponding to the level of the second control signal is emitted by the oscillating means and fed to the signal comparing means.

Thus the level of the first control signal is converted after being supplied with a fixed level signal, so that its amplitude will also be converted. Even though the center level of the first control signal to be fed to the signal converting means must be shifted, the amplitude of the first control signal will be varied in response to the shift of the center level, which prevents occurrence of such a phenomenon that the duty cycle of the first control signal varies even after adjustment of the center value. This allows the input signal variation range, in which the frequency of the oscillation signal is held in locked condition, to be made uniform on both the high frequency and low frequency sides.

In the phase locked loop oscillator circuit according to the present invention, as described to this point, the first control signal from the signal comparing means is supplied with a fixed level signal having a predetermined fixed level from the level converting means, and the level of this resultant first control signal is converted. This is followed by the signal converting means emitting a second control signal at a level corresponding to the duty cycle of the first control signal given thus by the level converting means, and then the oscillating means outputs an oscillation signal with a frequency corresponding to the level of the second control signal.

As level conversion of the first control signal is made after being supplied with a fixed level signal, in this manner, its amplitude will also be converted, and even though the center level of the first control signal to be fed to the signal converting means must be shifted, the amplitude of the first control signal will be varied in response to the shift of the center level, which prevents occurrence of such a phenomenon that the duty cycle of first control signal varies even after adjustment of the center value, which allows the output signal variation range, where the frequency of the oscillation signal is held in locked condition, to be made uniform on both the high frequency and low frequency sides.

BRIEF DESCRIPTION OF THE DRAWINGS

Other and further objects, features, and advantages of the invention will be more explicit from the following detailed description taken with reference to the drawings wherein:

FIG. 7 is a block diagram presenting the configuration of a PLL circuit 11 as one preferred embodiment of the invention, FIGS. 8(1), 8(2) and 8(3) are time charts exhibiting the operation of phase comparison circuit 12 in FIG. 7 and phase comparison circuit 2 in FIG. 1.

FIGS. 14 and 15 show waveforms presenting the operation of PLL circuit 11a.

DETAILED DESCRIPTION OF THE PREFERRED EMBODIMENTS

Figure 1:
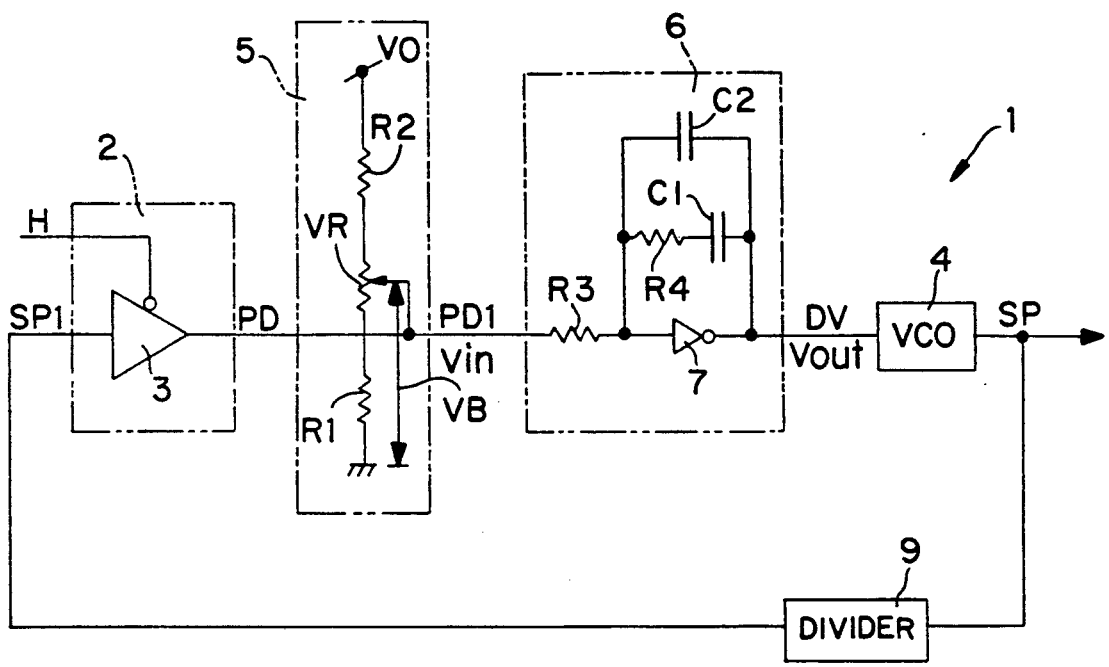
FIG. 1 is a block diagram typically illustrating the configuration of a conventional PLL circuit 1.

Referring to the drawings, preferred embodiments of the invention are described below.

Operation of the PLL circuit 11 as one embodiment of the invention will be described by reference to FIG. 7, which shows the configuration of the circuit in the form of a block diagram. This PLL circuit 11 is used, for example, in a TV receiver and generates a signal with an oscillation frequency synchronized with the horizontal synchronizing signal on the basis, for example, of the horizontal synchronizing signal separated from the complex video signal received.

The PLL circuit 11 is fed with a synchronizing signal H given from the outside such as the horizontal synchronizing signal of the video signal and with a synchronizing pulse SP1 obtained by dividing the synchronizing pulse SP, which is given by a voltage controlled oscillator (called hereinafter an oscillator) 26 included in the PLL circuit 11 by a divider 27 into a predetermined degree, and includes a phase comparator circuit 12 as a signal comparing means to generate a phase difference signal PD with a duty cycle corresponding to the amount of phase deviation upon comparison of the phases as described later. This phase comparator circuit 12 is equivalent to a three-state buffer 13, which operates in accordance with a table of truth value as shown in Table 1.

The output line 19 to which the phase difference signal PD is emitted, is connected with a level converting circuit 20 as a level converting means. This level converting circuit 20 consists of a resistor R6, a variable resistor VR1, and another resistor R7 in series connection, one end of the resistor R6 is grounded while the other end of the resistor R7 is connected with the reference potential VO (for example 5 V). The output line 19 is connected with a junction 21 between the resistor R7 and the variable resistor VR1.

A slider 22 included in this variable resistor VR1 is connected with the output line 23 of the level converting circuit 20, while this output line 23 is connected with an LPF 24 as a signal converting means. This LPF 24 is provided with a series circuitry of a resistor R8 and an inverter circuit 25, which can be formed as an integrated circuit due to CMOS technique, wherein the inverter circuit 25 is connected in parallel with a series circuitry of resistor R9 and capacitor C3 and with a capacitor C4.

The filtered voltage DV as the output from this LPF 24 is fed to the voltage controlled oscillator (called hereinafter an oscillator) 26, which emits a synchronizing pulse SP with a frequency corresponding to this difference voltage DV. This synchronizing pulse SP from the oscillator 26 is fed to the divider 27, as named before, to be divided with a predetermined frequency dividing ratio, and the resultant synchronizing pulse SP1 is fed to the three-state buffer 13.

Now a description is made by reference also to FIGS. 8 (1), 8(2) and 8(3) which illustrate a time chart for the fundamental operation of the PLL circuit 11. In the PLL circuit 11 built in a TV receiver etc., a synchronizing signal H as in FIG. 8(1) such as the horizontal synchronizing signal separated from the complex video signal received is fed to a phase comparator circuit 12, while the synchronizing pulse SP1 as in FIG. 8(2) obtained by dividing with the divider 27 the synchronizing pulse SP1 as the output of the oscillator 26 is fed to phase comparator circuit 12.

This phase comparator circuit 12 operates on the basis of the table of truth value in Table 1, which was described in the section of the Prior Art pertaining to the synchronizing signal H and synchronizing pulse SP1. Accordingly this phase comparator circuit 12 generates a phase difference signal PD with, for example, a minimum value of 0 V, a maximum value of VO (5 V), and therefore the center value DV as the mean value about the time being DV=VO/2 (=2.5 V), see FIG. 8(3). The period TD in FIGS. 8(1), 8(2) and 8(3) of the phase difference signal PD is in the variation range in which the duty cycle varies with respect to the phase difference between the synchronizing signal H and synchronizing pulse SP, while the period TS is in the fixation range in which the bias voltage VB set by the level converting circuit 20 is held.

Upon level conversion at the level converting circuit 20 as described later, this phase difference signal PD undergoes an integral operation outputting the difference voltage DV at a level corresponding to the duty cycle in the region SL below the center value CV, which is set by the LPF 24 about the phase difference signal PD in FIGS. 8(1), 8(2) and 8(3), with respect to the region SH above it. Thereby the oscillator 26 generates a synchronizing pulse SP with a frequency corresponding to the filtered voltage DV, and the sychronizing pulse SP1 as divided is fed back to the phase comparator circuit 12.

Figure 3:
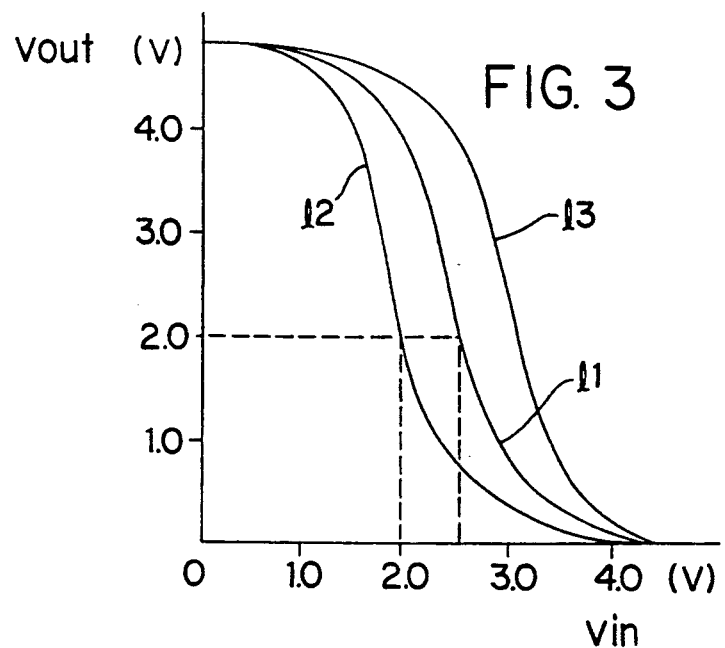
FIG. 3 is a graph indicating the characteristics of the thresholds of the inverter circuit 25 in FIG. 7 and the inverter circuit 7 in FIG. 1.
Figure 9:
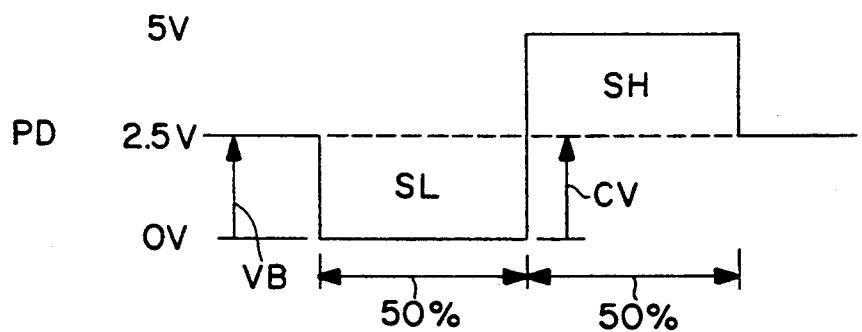
FIGS. 9, 10, 11 and 12 show waveforms describing the operation of the same embodiment of the invention.

When a difference voltage DV of 2.0 V is endeavored to acquire in case the inverting circuit 25 has a proper threshold voltage on the line 11 in FIG. 3, the center value of the phase difference signal PD1 as output from the level converting circuit 20 must be set to 2.5 V. In the circuit shown in FIG. 7, the resistor value of R6 is set to 3 kΩ, the total resistor value of VR1 to 2 kΩ, and the resistor value of R7 to 5.1 kΩ, and then the slider 22 is connected with the junction 21. Therein the output line 19 is fixed to this junction 21 in FIG. 7, and therefore the phase difference signal PD will become a signal having an amplitude of 2.5 V, a center value of 2.5 V, and a bias voltage VB of 2.5 V, see FIG. 9.

Because the slider 22 is connected to the junction 21, on the other hand, the phase difference signal PD1 will become the same signal as the phase difference signal PD. In this condition, the area of the portion SL below the center value 2.5 V is identical to that of the portion SH above it, the duty cycle being 50%. Whether the synchronizing signal H is going to move from this condition to the high frequency side or low, the PLL circuit 11 will have the same correction range, in which oscillating motion can be made to generate a synchronizing pulse SP with the varying frequency according to moving of synchronizing signal H.

In case the inverting circuit 25 consists of a circuit with relatively low threshold as shown, for example, by the line 12 in FIG. 3, on the other hand, the center value CV of the phase difference signal PD1 must be set to 2.0 V. In the level converting circuit 20, therefore, the slider 22 is shifted from the junction 21 toward the ground potential. In case the slider 22 is connected with the junction 21, the VB=2.5 V has been accomplished by the added resistance value 5 kΩ of the resistance R6 and the total resistance value of VR1, so that the resistance value R for achieving CV=2.0 V is expressed as follows:

$$R = \frac{2\,V \times 5\,k\Omega}{2.5\,V} = 4.0\,k\Omega \quad (1)$$

Figure 10:
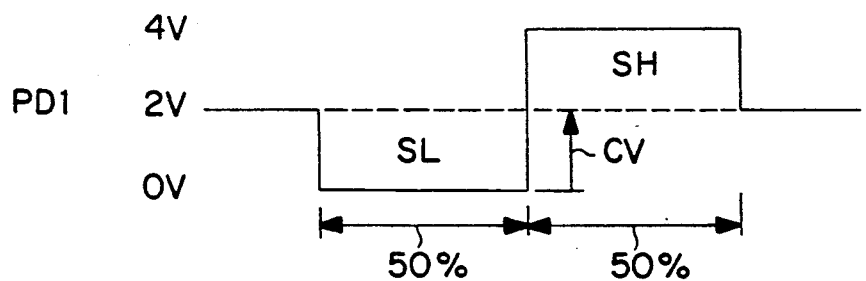

Therefore, the amplitude of the phase difference signal PD in this embodiment is compressed by the ratio 5:4, which provides a phase difference signal PD1 as shown in FIG. 10.

Figure 2:
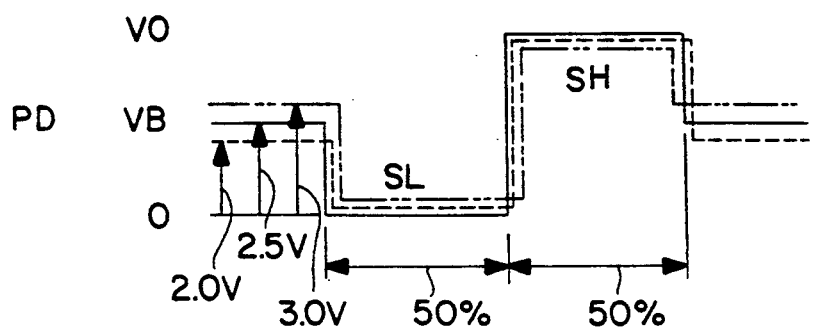
FIG. 2 shows a waveform presenting the operation of PLL circuit 1.
Figure 4:
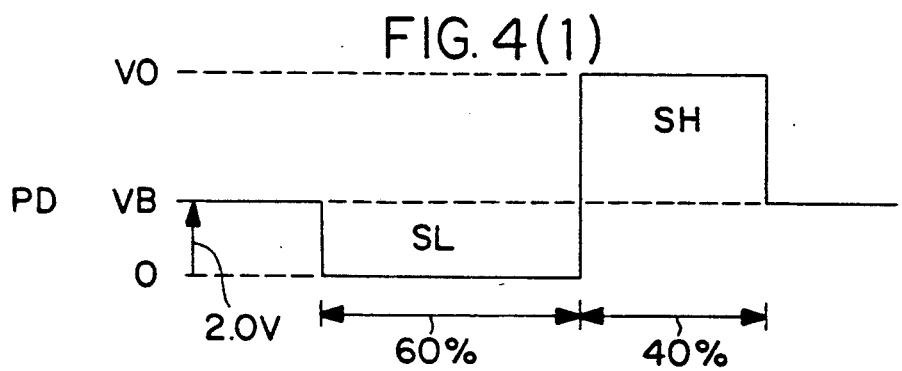
FIGS. 4(1), 4(2), 5 and 6 show waveforms illustratively describing the operation of a conventional arrangement.
Figure 4:
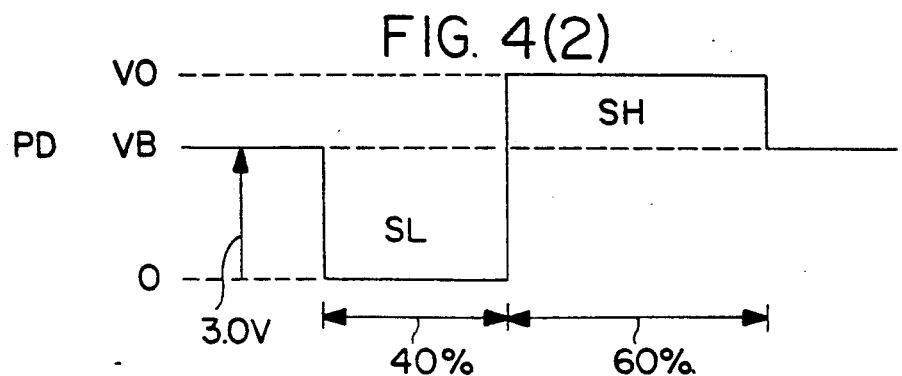
Figure 5:
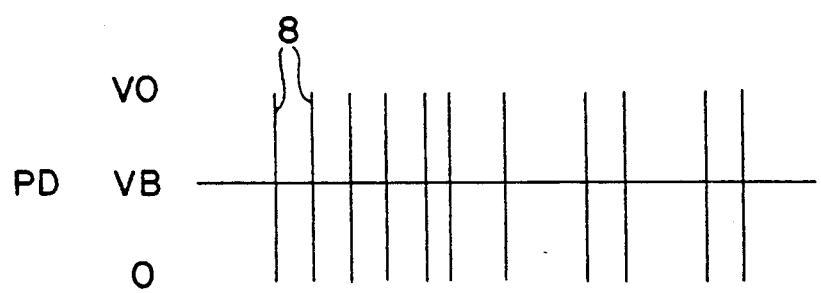
Figure 6:
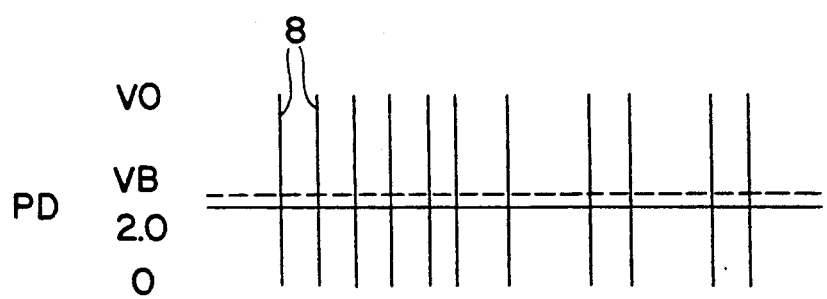

With this phase difference signal PD1, the area of the portion SL below the new center value (CV) (2 V) remains equal to that of the region SH above it. This prevents occurrence of the phenomenon that the duty cycle of the phase difference signal PD is kept fixed to a value other than 50%, which was described by reference to FIGS. 2 and 4 in the section of the Prior Art.

Figure 11:
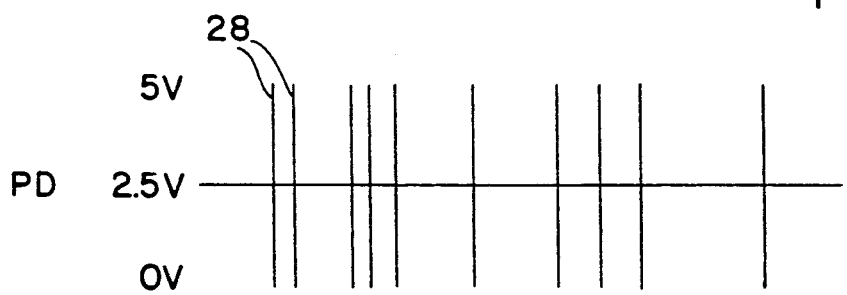
Figure 12:
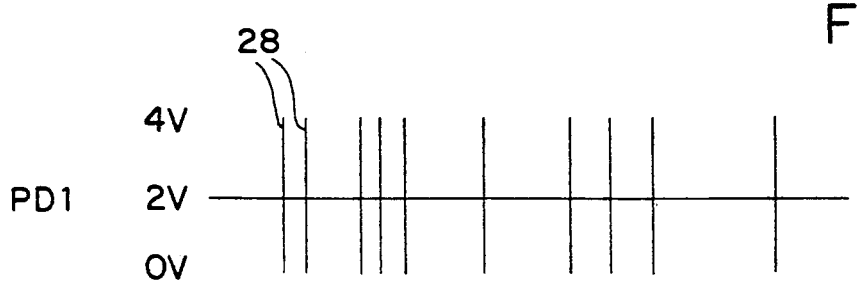

Now description is made to the case where synchronization of the synchronizing signal H has become turbulent as shown in FIG. 11 to cause noise inclusion in the input, which has turned the phase difference signal PD into the condition of noise 28 in FIG. 11. In case the inverter circuit 25 consists of a circuit having the characteristic of the line 11 in FIG. 3, connecting the slider 22 with junction 21 gives a center value of 2.5 V, which is the time mean value of the phase difference signal PD, and this is identical to the bias voltage VB to be set by the level converting circuit 20. Use of an element having a constant threshold, as shown by the line 12 in FIG. 3, to the inverting circuit 25, on the other hand, will shift the slider 22 toward the ground potential in the level converting circuit 20.

At this time, the bias voltage VB in the level converting circuit 20 changes from 2.5 V to 2 V, but a compression takes place so that the level of the noise component 28 in the phase difference signal PD will also have a maximum value of 4 V. Accordingly, the time mean value of such noise components, i.e. the center value CV, will become 2 V, which is identical to the bias voltage VB. When noise input into the phase comparator circuit 12 is completed followed by input of the proper synchronizing signal H, therefore, undesired shift of the oscillation frequency as described associate with the Prior Art can be suppressed.

In description of the embodiment the cases with 11 and 12 in FIG. 3 were taken up in respect of the threshold of the inverting circuit 25, but the invention may be embodied even in the case of undesirably high threshold as shown by the line 13 in FIG. 3. Therein the variable resistor VR1 and resistor R7 in FIG. 7 may be put together to constitute one variable resistor, and the slider 22 be shifted from the junction 21 toward the power supply.

Figure 13:
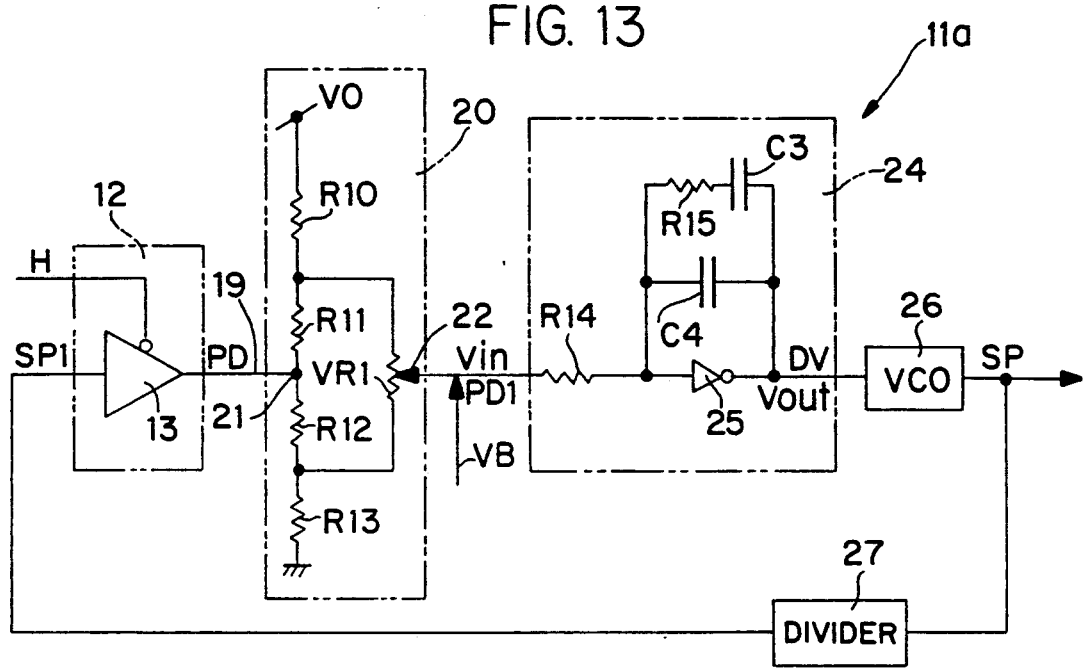
FIG. 13 is a block diagram presenting the configuration of a PLL circuit 11a as another preferred embodiment of the invention.

FIG. 13 is a block diagram of PLL circuit 11a as another embodiment of the invention. This embodiment has similar configuration of the embodiment mentioned above, corresponding parts are given equivalent reference symbols. Explanation of the corresponding parts is eliminated. The characteristic points of this embodiment are that the output line 19 to which the phase difference signal PD is emitted, is connected with a level converting circuit 20 as a level converting means. The level converting circuit 20 is provided with resistance R10, R11, R12, R13 in series, one terminal of a variable resistance VR1 is connected between resistance R10, R11 as the first resistance means, and another terminal is connected between resistors R12, R13 as the second resistance means, and the variable resistor VR1 is connected with resistors R11, R12 in parallel. An opposite terminal of resistor R13 against resistor R12 is connected with ground potential as the first constant level potential, and a opposite terminal of resistance R10 against the resistance R11 is connected with the reference potential VO (for example 5 V). The output line 19 is connected with a junction 21 between resistors R11, R12.

When a difference voltage DV of 2.0 V is endeavored to acquire in case the inverting circuit 25 has a proper threshold voltage on the line 11 in FIG. 3, the center value of the phase difference signal PD1 as output from the level converting circuit 13 must be set to 2.5 V. In the circuit shown in FIG. 13, the resistance value of R10-R13 is set to 1 kΩ, 10 kΩ, 10 kΩ, 1 kΩ, and VR1=1 kΩ and then the slider 22 is adjusted to the center of the variable resistance VR1. Therein the output line 19 is fixed to this junction 21 of fixed potential 2.5 V in FIG. 13, and therefore the phase difference signal PD will become a signal having an amplitude of 2.5 V, a center value of 2.5 V, and a bias voltage VB of 2.5 V, see FIG. 9.

By this operation, the amplitude of phase difference signal PD is suppressed identically in both parts above and below a bias voltage VB, thereby the phase difference signal PD1 can be generated. In this condition, the area of the portion SL below the center value 2.5 V is identical to that of the portion SH above it, the duty cycle being 50%. Whether the synchronizing signal H is going to move from this condition to the high frequency side or low, the PLL circuit 11 will have the same correction range, in which oscillating motion can be made to generate a synchronizing pulse SP with the varying frequency according to moving of synchronizing signal H.

In case the inverting circuit 25 consists of a circuit with relatively high threshold as shown, for example, by the line 13 in FIG. 3, on the other hand, the center value CV of the phase difference signal PD1 must be set to 3.0 V. In the level converting circuit 20, therefore, the slider 22 is connected with the position of the variable resistance VR1 emitting potential among minimum potential 1.7 V and maximum potential 3.3 V.

Figure 14:
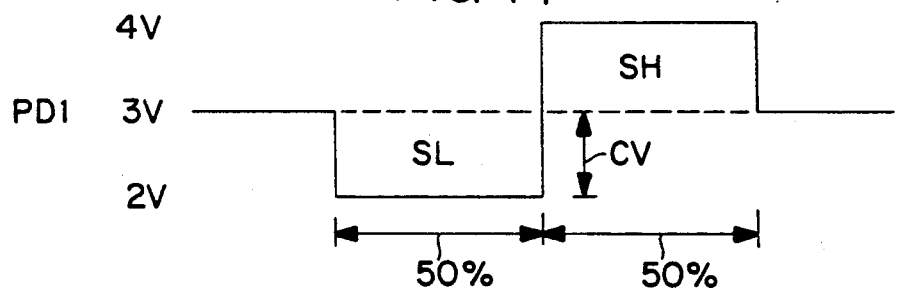

Therefore, the amplitude of the phase difference signal PD in this embodiment is compressed which provides a phase difference signal PD1 as shown in FIG. 14.

With this phase difference signal PD1, the area of the portion SL below the new center value (CV) (3 V) remains equal to that of the region SH above it. This prevents occurrence of the phenomenon that the duty of the phase difference signal PD is kept fixed to a value other than 50%, which was described by reference to FIGS. 2 and 4 in the section of the Prior Art.

Now description is made of the case where synchronization of the synchronizing signal H has become turbulent as shown in FIG. 11 to cause noise inclusion in the input, which has turned the phase difference signal PD into the condition of noise 28 in FIG. 11. In case the inverter circuit 25 consists of a circuit having the characteristic of the line 11 in FIG. 3, because the slider 22 is connected with the central position of the variable resistance VR1, the amplitude wave form of the phase difference signal PD is supressed identically in both parts above and below a bias voltage VB, to become the phase difference signal PD1, having a center value of 2.5 V, which is the time mean value of the phase difference signal PD1, and this is identical to the bias voltage VB to be set by the level converting circuit 20. Use of an element having a high threshold, as shown by the line 13 in FIG. 3, in the inverting circuit 25, on the other hand, will shift the slider 22 as mentioned in the level converting circuit 20.

Figure 15:
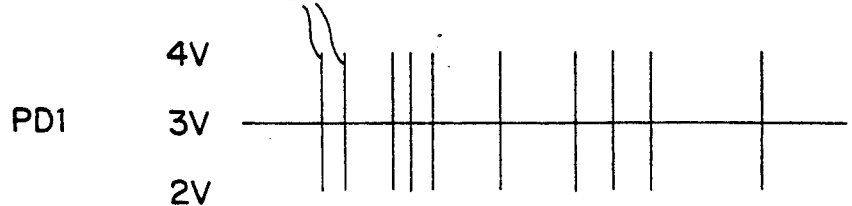

At this time, the bias voltage VB in the level converting circuit 20 changes from 2.5 V to 3 V as shown FIG. 14, but a compression takes place so that the level of the noise component 28 in the phase difference signal PD will also have a maximum value of 4 V as shown in FIG. 15. Accordingly, the time mean value of such noise components, i.e. the center value CV, will become 3 V, which is identical to the bias voltage VB. When noise input into the phase comparator circuit 12 is completed followed by input of the proper synchronizing signal H, therefore, undesired shift of the oscillation frequency as described associate with the Prior Art can be suppressed.

In description of the embodiment the cases with 13 in FIG. 3 were taken up with respect to the threshold of the inverting circuit 25, but the invention may be embodied even in both the cases of suitable threshold and undesirably low threshold as shown by the lines 11 and 12 in FIG. 3.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A phase locked loop oscillating circuit comprising:
   signal comparing means for comparing a plurality of different input signals with each other and for emitting a first control signal with a duty cycle related to the degree of difference of the compared signals;
   level converting means, operatively connected to said signal comparing means, for receiving and converting said first control signal and emitting a fixed level signal stabilized at a 50% duty cycle, independent of fluctuations in threshold voltages and and noises;
   signal converting means, operatively connected to said level converting means, for emitting a second control signal at a level corresponding to the duty cycle of the converted first control signal from the level converting means; and
   oscillating means, operatively connected to the signal converting means, for emitting an oscillating signal at a frequency corresponding to the level of the second control signal and for feeding, the ocillation signal to the signal comparing means as an input signal.

2. The phase locked loop oscillating circuit claimed in claim 1, wherein the signal comparing means comprises, a phase comparator circuit, for comparing the phase of the oscillation signal with a synchronizing signal separated from a complex video signal, and for emitting the first control signal with a duty cycle corresponding to the phase difference of the signals.

3. The phase locked loop oscillating circuit claimed in claim 1, wherein the level converting means comprises, a variable resistor interposed between a predetermined reference potential and a ground potential, and the first control signal is fed to the variable resistor, which converts the level of the first control signal and emits the result of the conversion.

4. The phase locked loop oscillating circuit claimed in claim 1, wherein the signal converting means comprises, a low-pass filter comprising a series invertor circuit of CMOS (complementary metal oxide semiconductor) structure and a resistance.

5. A phase locked loop oscillating circuit comprising:
   signal comparing means for comparing a plurality of different input signals with each other and for emitting a first control signal with a duty cycle corresponding to the degree of difference of the compared signals;
   level converting means, operatively connected to said signal comparing means, for converting the first control signal and for emitting the level of the converted first control signal, said level converting means comprising;
   a first resistance means receiving the first control signal to one side terminal and connected with a predetermined first constant level potential at another terminal,
   a second resistance means receiving the first control signal to one side terminal and connected with a second constant level potential different from the first constant level potential at another terminal,
   a variable resistance means including two terminals, receiving respectively emission from the first resistance means and the second resistance means in both terminals, said variable resistance means converting the output level of the different potentials of each emission,
   signal converting means operatively connected to the level converting means for emitting a second control signal at a level corresponding to a duty cycle the first control signal emitted by the level converting means; and
   oscillating means operatively connected to the signal converting means for emitting an oscillating signal at a frequency corresponding to the level of the second control signal and for feeding the oscillating signal to the signal comparing means as an input signal.

6. The phase locked loop oscillating circuit claimed in claim 5, wherein the signal comparing means comprises a phase comparator circuit, which compares the phase of the oscillation signal with a synchronizing signal separated from a complex video signal and emits the first control signal with a duty cycle corresponding to the phase difference of the signals.

7. The phase locked loop oscillating circuit as claimed in claim 5, wherein the signal converting means comprises a low-pass filter including a series invertor circuit of CMOS (complementary metal oxide semiconductor) structure and a resistance.

8. The phase locked loop oscillating circuit claimed in claim 3, further including a first fixed resistor located between said variable resistor and said predetermined reference potential; and
   a junction located between said first fixed resistor and said variable resistor.

9. The phase locked loop oscillating circuit claimed in claim 8, further including a second fixed resistor, said second fixed resistor located between the variable resistor and the ground potential.

10. The phase locked loop oscillating circuit claimed in claim 1, wherein said first resistance means includes a fixed resistor with a first and second terminal, said second resistance means includes a fixed resistor with a first and second terminal, the signal emitted from said signal comparing means being input at a fixed point located between the first terminals of said fixed resistors, and
    a variable resistor operatively connected to the second terminal of each fixed resistor, said second terminals being a varying point so that bias and maximum voltage can be varied.

11. The phase locked loop oscillating circuit claimed in claim 10, wherein said variable resistor outputs a phase difference signal into the signal converting means.

12. The phase locked loop oscillating circuit as claimed in claim 1, further including a divider located between said oscillating means and said signal comparing means, for receiving the oscillation signal before the oscillating signal is received in the signal comparing means.

13. The phase locked loop oscillating circuit as claimed in claim 5, further including a divider located between said oscillating means and said signal comparing means, for receiving the oscillation signal before the oscillating signal is received in the signal comparing means.

* * * * *